(12) United States Patent
Greenhoe

(10) Patent No.: US 6,647,054 B1
(45) Date of Patent: Nov. 11, 2003

(54) MULTIPLE MASK ARRANGEMENT FOR JUMPING IN PSEUDO-NOISE SEQUENCES

(75) Inventor: Daniel J. Greenhoe, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/474,302

(22) Filed: Dec. 29, 1999

(51) Int. Cl.[7] .............................................. H04B 15/00
(52) U.S. Cl. ........................ 375/140; 714/752; 714/739
(58) Field of Search ................................. 375/130, 135, 375/136, 146, 147, 272, 140, 377; 370/320, 335; 708/253, 250, 252, 255, 254; 714/738, 719, 720; 377/26

(56) References Cited

U.S. PATENT DOCUMENTS

| | | | | |
|---|---|---|---|---|
| 5,228,054 A | * | 7/1993 | Rueth et al. | 708/252 |
| 5,532,695 A | * | 7/1996 | Park et al. | 341/173 |
| 5,631,913 A | * | 5/1997 | Maeda | 714/732 |
| 5,754,604 A | | 5/1998 | Li et al. | 375/367 |
| 5,878,076 A | | 3/1999 | Siedenburg | 375/206 |
| 6,038,577 A | * | 3/2000 | Burshtein | 708/252 |
| 6,041,429 A | * | 3/2000 | Koenemann | 714/738 |
| 6,061,417 A | * | 5/2000 | Kelem | 377/26 |
| 6,282,230 B1 | * | 8/2001 | Brown et al. | 375/140 |
| 6,339,781 B1 | * | 1/2002 | Sasaki | 708/252 |
| 6,353,842 B1 | * | 3/2002 | Rajski et al. | 708/252 |
| 6,430,246 B1 | * | 8/2002 | Ozluturk | 375/377 |
| 6,459,722 B2 | * | 10/2002 | Sriram et al. | 375/130 |
| 6,490,317 B1 | * | 12/2002 | Huscroft | 375/224 |

FOREIGN PATENT DOCUMENTS

| | | | |
|---|---|---|---|
| EP | 0660541 A2 | 6/1995 | ........... H04B/1/707 |
| WO | WO9935564 | 7/1999 | ............. G06F/7/58 |
| WO | WO9945670 | 9/1999 | ........... H04K/1/02 |

* cited by examiner

*Primary Examiner*—Emmanuel Bayard
(74) *Attorney, Agent, or Firm*—Michael E. Belk

(57) ABSTRACT

Multiple masks are applied in a selected combination to a pseudo-noise sequence (PNS) output from a linear feedback shift register to shift the position of the PNS by a desired amount. Each mask shifts the PNS by a power of 2 and the selected combination of masks adds these shifts to provide the selected shift. The desired bit length of the shift in binary form is directly mapped to a combination of masks to apply the correct masking to the PNS.

18 Claims, 3 Drawing Sheets

MULTIPLE MASK ARRANGEMENT FOR JUMPING IN PSEUDO-NOISE SEQUENCES

FIELD OF THE INVENTION

The invention is related to the field of direct-sequence spread spectrum communication systems such as those implementing the CDMA-2000, UMTS, IS-95 standards and similar cellular telephone systems which apply a pseudo-noise sequence for encoding and decoding data.

BACKGROUND OF THE INVENTION

Spread spectrum communication systems are finding increased use in two-way aerial communication. Just as AM and FM systems use a sinusoidal signal to carry information, spread spectrum systems use a noise-like signal to carry information. In a transmitter, a stream of digital data is encoded with a pseudo-noise sequence (PNS) to spread the spectrum of the signal for transmitting the data through a media. At a receiver the data is recovered from the media and then decoded using the same PNS to de-spread the spectrum of the signal to reproduce the original digital data stream.

A PNS is a stream of bits with a pattern that is determinate, but which appears to be a random bit stream. A common apparatus for producing a PNS is a linear feedback shift register (LFSR). Two common types of LFSRs are Fibonacci LFSRs and Galois LFSRs. Both types include a closed loop circuit containing bit registers and modulo-2 adders through which bits are shifted through the loop. The adders have one input that is part of the loop and another input that is connected to another part of the loop to form multiple loops to randomize the bits as they are shifted through the loop.

The values of the PNS for any LFSR, repeat after a large number of bits and it is desirable to provide a PNS with the longest possible sequence without repeating using a limited amount of hardware. This is accomplished by choosing the configuration of the adders and registers of the LFSR and the initial values of the registers in a manner well known in the art. For a given number of registers m contained in the LFSR, the longest possible non-repeating portion of the PNS is equal in length to $2^m-1$ bits.

In addition to using the same PNS, the transmitter and receiver must use values from the same position in the PNS for spreading and de-spreading respectively. In order to synchronize the transmitter and receiver to both use values at the same position in the PNS, an offset mask value is calculated and combined with the output values of the current position of the PNS (in-the transmitter or receiver) to produce the values of a different shifted position in the PNS in a manner well known in the art.

Those skilled in the art are directed to the following citations. U.S. Pat. No. 5,878,076 to Siedenburg describes a direct sequence spread spectrum communication system. U.S. Pat. No. 5,754,603 to Thomas describes PNS synchronization. U.S. Pat. No. 5,926,070 to Barron describes offset mask generation. European patent application publication 0 660 541 by Ishida describes methods of synchronizing PNS positions of a transmitter and receiver. PCT patent application publication WO 99/45670 by Medlock describes masks for LFSRs.

FIG. 1 describes selected portions of a Galois LFSR with an offset mask. LFSR 100 includes a multitude of binary registers 101–108 connected in series in a loop circuit. The binary registers may be D-flip-flops or other know bit storage devices. Using register 102 as an example, each register 102 has a value input 110 connected to an output 111 of a previous register 101 and each register 102 has an output 112 connected to the value input 113 of a subsequent register 103.

LFSR 100 also includes one or more modulo-2 adders 115–117 connected in the loop circuit. Each adder is inserted between a different pair of sequential registers 101–108 of the register series. The selection of the pairs of registers between which adders are inserted, depends on the selection of a primitive binary polynomial. A primitive polynomial is similar in concept to a prime number. A primitive polynomial is a polynomial that can not be divided by any simpler polynomial. For the specific example LFSR shown in FIG. 1, the primitive binary polynomial is $D^8+D^4+D^3+D^2+1$. The $D^8$ requires the LFSR to have 8 registers, and the $D^2$, $D^3$ and $D^4$ terms require adders be inserted between the second to the last, third from the last, and fourth from the last pairs of registers as shown. Primitive polynomials, like prime numbers, are well known in the art.

The inserted adders 115–117 each have two inputs and one output and may be simply implemented as XOR gates. As an example, adder 115 has first input 120 connected to output 121 of previous register 104 and output 122 connected to value input 123 of subsequent register 105. Also, adder 115 has second input 124 connected between output 125 of last register 108 and input 126 of first register 101 of the register series. Clock signal line 130 is connected to a clock input of each register of the register series, and when a clock signal is transmitted through the clock signal line, each register begins to output the value being received at that time at the register's value input. For example, clock signal line 130 is connected to clock input 131 of register 101.

Control lines 135 includes at least one initialization line 136 connected to each register 101–108 in order to initialize the values of the registers. For example, initialization line 136 is shown connected to initialization input 137 of register 108. The initialization line may write a memory value into the register so that any initial value can be written into any register as desired. In that case, the initial values of the registers are usually predetermined and stored in a memory. Alternatively, the control line may simply signal the register to assume some predetermined initial value that is built into the hardware of the particular register. If the registers are D-flip-flops the initialization line is connected to the set input of every register to be initialized to one and connected to the reset input of every register to be initialized to zero, and when the initialization line goes high, the values of the registers assume their respective initial values. Methods for selecting the initial values of the registers for a particular primitive polynomial are well known and further discussion is not required herein.

The Galois LFSR shown in FIG. 1 outputs bit values for the PNS at output 138. However, in order for a receiver to synchronize the position of the output values in the PNS with the position of output values for a transmitter using the same PNS (or vice versa), offset mask values must be combined with a previously output portion of the PNS.

Mask 140 is connected with output 138 of Galois LFSR 100 as shown in FIG. 1. The mask includes a series of registers 141–148 which respectively store the previous 8 values of the PNS output from the LFSR. The outputs of registers 142–148 are connected to the inputs of respective subsequent registers 141–147. For example, input 149 of register 146 is connected to output 150 of register 147, and output 151 of register 146 is connected to the input 152 of register 145.

The mask also includes a series of modulo-2 adders 161–167 with a first input of each subsequent adder 162–167 connected to an output of a previous respective adder 161–166 in the adder series. For example, input 153 of adder 165 is connected to output 154 of adder 164 and output 155 of adder 165 is connected to input 156 of adder 166. A multitude of mask switches 171-178 include a first mask switch 171 with an output 179 connected to a first input 180 of first adder 161 of the adder series. Also, subsequent mask switches 172–178 have outputs connected to respective second inputs of adders 161–167 in the adder series. The output of each register 141–148 is connected to the input of respective switches 171–178.

Mask value lines 191–198 of control lines 135 are connected respectively to switches 171–178, in order to set respective switches 171–178 in an open or closed position which controls whether the value of a respective register is provided through the respective switch to a respective input of a respective adder of adders 161–167. For example, output 151 of register 146 is connected to input 182 of switch 175 and output 183 of switch 175 is connected to input 184 of adder 165. Thus, when switch line 196 is set to 1, then the value of register 146 is modulo-2 added with the output value of output 154 of adder 164 and the result is output at output 155 to input 156 of adder 166. Otherwise, when switch line 183 is set to 0, then the output value from output 154 of adder 164 simply passed through adder 165 to input 156 of adder 166. Finally, output terminal 199, connected to the output of last modulo-2 adder 167 in the adder series, outputs the value of the masked PNS.

Microcontroller 200 includes a processor 201, clock 202, and memory 203 interconnected by a bus 204. A power supply 205 provides power to operate the processor, memory and clock. The clock provides timing signals to the processor and memory to synchronize operations. The memory of the microcontroller contains a data module 206 containing the initial values for registers 101–108 and program module 207 to control the processor to transfer those initial values through control lines 135 to those registers at initialization. The memory also includes program module 208 to calculate the mask values in a manner well known in the art, so as to synchronize the respective values provided by the masked PNS of a transmitter and receiver.

In known LFSR systems, when the position of the output in the PNS needs to be synchronized, the system determines the bit length of the required forward or backwards jump in the PNS, then the system either calculates the value of the jump mask using software or reads the value of the jump mask from a table depending on the bit length and direction of the jump. Then the mask values are applied to the mask switches of the mask, and the mask values are combined with a previous portion of the output of the LFSR and the results combined by modulo-2 addition to provide the synchronized masked PNS.

The above citations are hereby incorporated herein in whole by reference.

SUMMARY OF THE INVENTION

In the invention of applicants, multiple masks are applied in combination to previous outputs of a PNS sequence, so that, it is not necessary to store a large table of jump values or spend time calculating mask values for a jump. The desired length of the jump in binary form can be directly mapped to a combination of masks to provide the correct masking to the PNS.

Those skilled in the art will understand the invention and additional objects and advantages of the invention by studying the description of preferred embodiments below with reference to the following drawings that illustrate the features of the appended claims:

DETAILED DESCRIPTION OF THE PREFERRED EMBODIMENTS

In the following drawings, similar components in different drawings have the same labels to simplify description.

Figure 1:
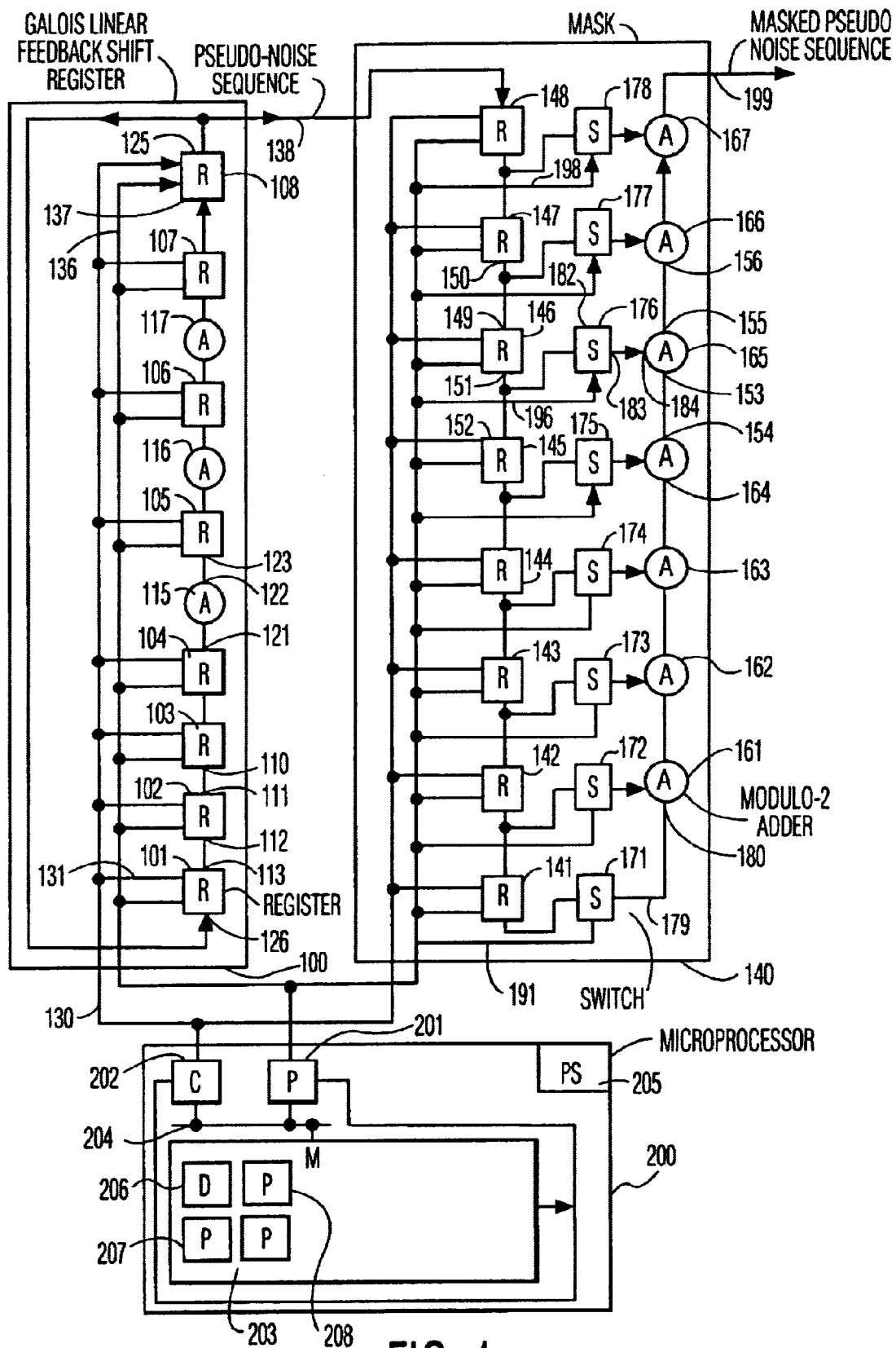
FIG. 1 illustrates typical features of previous combination of a Galois linear feedback shift registers (LFSRs) in combination with a mask.
Figure 2:
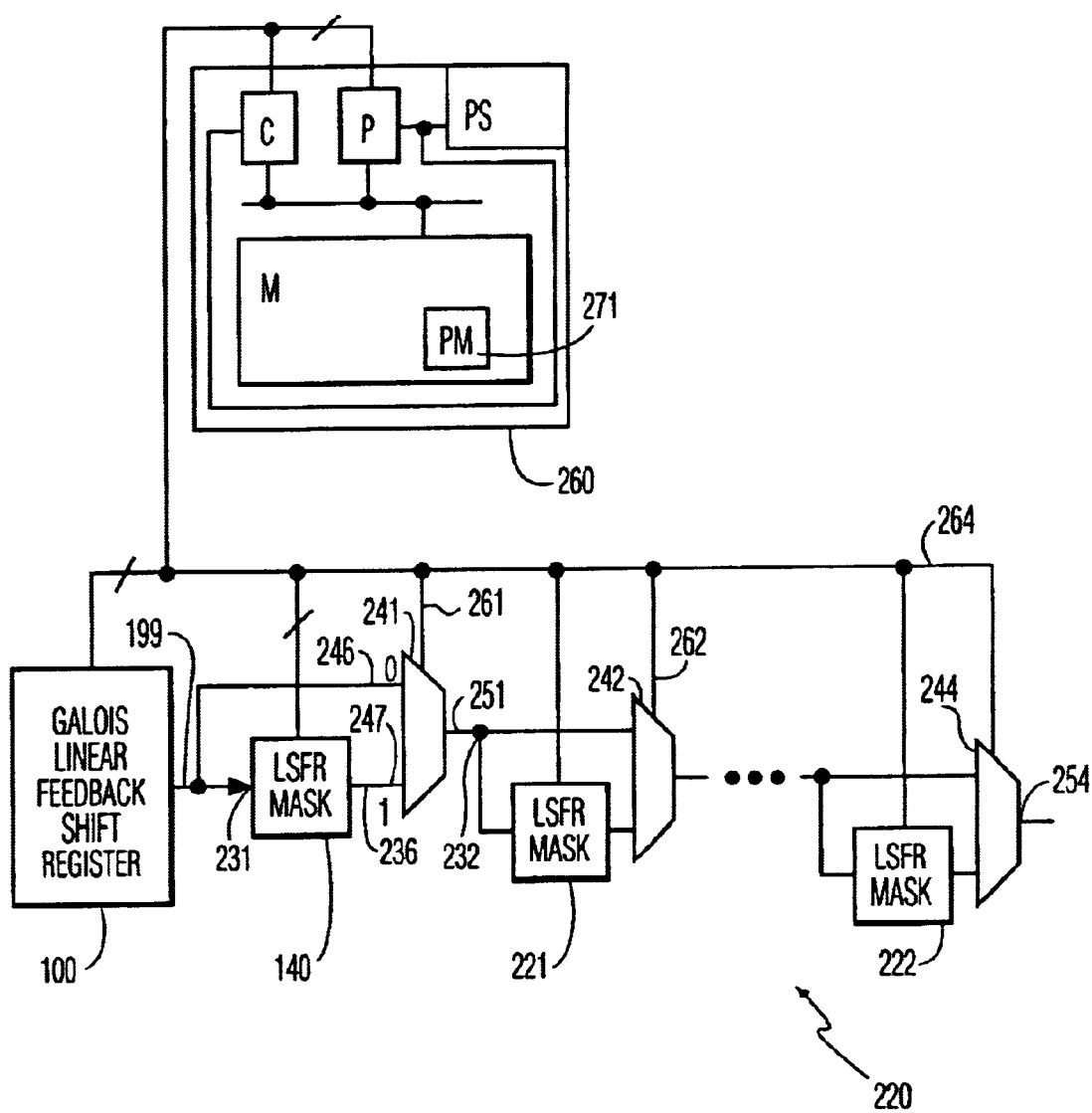
FIG. 2 shows the Galois LFSR of FIG. 1 combined with an array of masks,to form a PNS generator of the invention, the masks being similar to the mask of FIG. 1.

FIG. 2 illustrates an embodiment 220 of the invention with a Galois linear feedback shift register (LFSR) 220 of FIG. 1 in combination with an array of similar LFSR masks of the invention. The array of masks form a series or previous and subsequent LFSR masks and includes mask 140 of FIG. 1 and a multitude of similar masks 221–222 of the invention that may be identical to mask 140.

LFSR 100 produces a PNS that is provided from output 199. Each of the LFSR masks, as illustrated for LFSR mask 141, has a respective input 231 and a respective output 236. Each LFSR mask provides from its output, an output PNS that is shifted within the PNS with respect to an input PNS provided to its input.

A respective switch 241, 242 and 244 is provided for each LFSR mask. Each switch, as described for switch 241, has first input 246 and second input 247 and one output 251, to selectively connect a signal at either input as an output signal. For each switch and respective LFSR mask, as described for switch 241 and LFSR mask 140, input 231 of LFSR mask 140 is connected to first input 246 of switch 241 and output 236 of LFSR mask 140 is connected to second input 247 of switch 241, so that switch 241 outputs either the PNS input to LFSR mask 140 or the shifted PNS output from LFSR mask 140.

The input of first LFSR mask 140 in the LFSR mask series is connected to the output of LFSR 100. The input of each subsequent LFSR mask in the LFSR series is connected to the output of the switch of the previous LFSR mask. For example, input 232 of LFSR mask 221 is connected to switch 241 for LFSR mask 104. Output 254 of switch 244 for last LFSR mask 222 in the series of LFSR masks, provides the output of the PNS generator.

Controller 260 of FIG. 2 is similar to microcontroller 200 of FIG. 1 and duplicate portions will not be further described. Microcontroller 260 also includes connections for control lines 261, 262 and 264 to control switches 241, 242, and 244 respectively, and program module 271 which maps the bits of a desired offset of the PNS to the control lines. Control lines 261, 262 and 264 determine for respective masks 140, 221, 222, whether the PNS transmitted from output 233 travels through each mask. The effect of the PNS traveling through a mask is to offset the position of the PNS transmitted through the mask by an amount depending on the particular mask values applied to the switches of the mask. The effect of transmitting the PNS through multiple masks is simply to offset the position of the PNS by the sum of the offsets of the multiple masks in a single operation step. If the mask values of the masks are selected to provide offsets which are the powers of two (e.g. 1, 2, 4, 8, 16, . . . ) then the values of the control lines 261–264 of switches 241–244 are simply the binary digits of the desired offset.

More specifically if there are 8 registers in the LFSR then there are 8 LFSR masks 140, 222 that are initialized with mask values that offset the PNS by even binary digits $2^7$ through $2^0$, respectively. Thus, when a binary offset of 10000001 is required, then only corresponding switches 241 and 244 are activated, and the PNS transmitted from output 234 only flows through masks 140 and 222 and is offset by 10000001.

Figure 3:
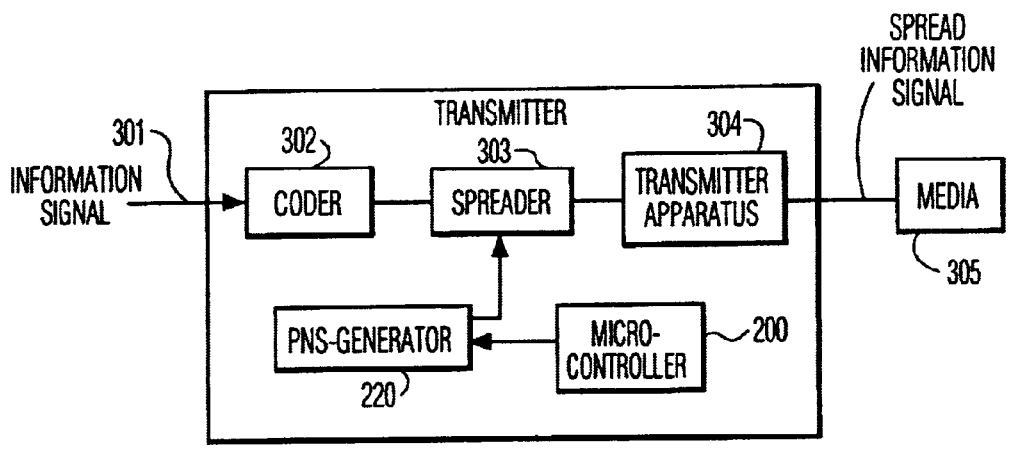
FIG. 3 illustrates a transmitter using the PNS generator of FIG. 2.

FIG. 3 illustrates a transmitter 300 of the invention which utilizes the masked Galois LSFR 220 of FIG. 2. Microcontroller 200 is connected to provide clock, register initialization, mask values, and switch settings to PNS-generator 220 as described above in relation to FIG. 2. An information signal is received through an input 301 into coder 302 which converts the information into a serial bit stream. For example, the coder may convert analog voice input into a bit stream. If the information received through the input is already a serial bit stream then the coder may not be required. The bit stream is spread by spreader 303 depending on the output of the masked Galois LFSR 220 of the invention, in order to provide a spread information signal. Transmitter apparatus 304 transmits the spread information signal into media 205. The transmitter may be, for example, a modulator antenna for broadcasting the spread information signal through the airways; a channel encoder and media drive for writing the spread information signal onto computer media; or the transmitting apparatus, may be a modulator connected to a broadband network.

Figure 4:
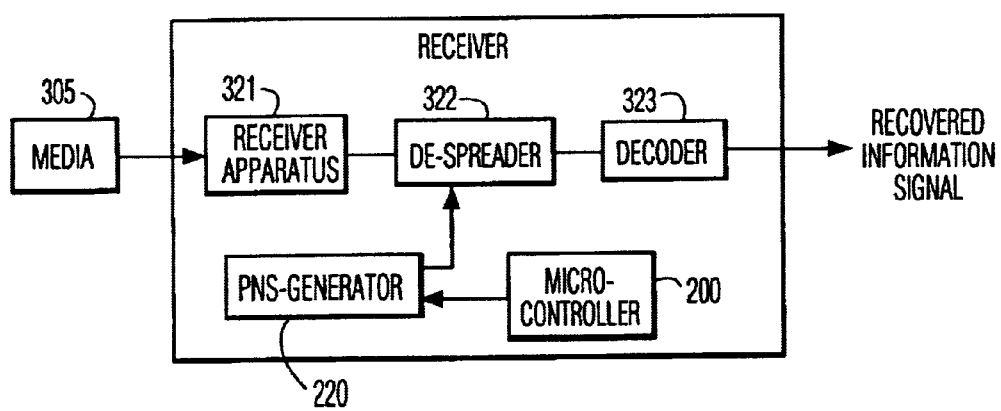
FIG. 4 shows a receiver using the PNS generator of FIG. 2.

FIG. 4 shows a receiver 320 for receiving the spread information signal produced by the transmitter of FIG. 3 and reproducing the information signal originally input into the transmitter. Receiving apparatus 321 receives the spread information signal from media 305 discussed above. De-spreader 322 de-spreads the spread information to provide the coded bit stream described above. Decoder 323 decodes the coded bit stream to reproduce the information signal that was originally received by transmitter 300. The PNS-generator 220 is the same PNS-generator as the PNS-generator of FIG. 3. A pseudo-noise sequence (PNS) has been positioned by a mask of the invention to position the PNS for de-spreading the spread information signal.

The invention has been disclosed with reference to specific preferred embodiments, to enable those skilled in the art to make and use the invention, and to describe the best mode contemplated for carrying out the invention. Those skilled in the art may modify or add to these embodiments or provide other embodiments without departing from the spirit of the invention. Thus, the scope of the invention is only limited by the following claims:

What is claim is:

1. A pseudo-noise sequence (PNS) generator comprising:
   a linear feedback shift register (LFSR) for producing a PNS at an output;
   a plurality of LFSR masks each having a mask input and a mask output, the mask input having a version of the PNS and the mask output providing a shifted version of the PNS with respect to the version of the PNS provided to the mask input, the LFSR masks forming a series of previous and subsequent LFSR masks;
   a plurality of registers within each of the masks arranged to form a binary shift register, each register a having a register input and a register output sequentially connecting the registers, the registers being operatively configured such that bits defining the version of the PNS will be shifted from a first register to a last register;
   a series a switches within each of the LFSR masks operatively connected to receive the register outputs, each of the switches having a switch input and a switch output; and
   a series of adders within each of the LFSR masks, each of the adders having at least a first input, a second input and a single output, and wherein the switches selectively controls the adders to operate on the first input and the second input or to pass the second input to the single output, wherein either the version of the PNS or the shifted version of the PNS is output by the series of adders;
   wherein the mask input of a first LFSR mask in the LFSR mask series is connected to the output of the LFSR, the mask input of each subsequent LFSR mask in the LFSR series is connected to the single output of the switch of the previous LFSR mask, the single output of the respective switch for a last LFSR mask in the series of LFSR masks, provides a PNS generator output.

2. The PNS generator of claim 1, in which: the LFSR is a Galois LFSR; and each mask shifts the PNS by a different power of 2 bits.

3. The pseudo-noise sequence (PNS) generator of claim 2 wherein the series of adders perform modulo-2 addition.

4. The pseudo-noise sequence (PNS) generator of claim 3 wherein an offset is applied to the PNS is determined by a set of values that are applied to the switches.

5. The pseudo-noise sequence (PNS) generator of claim 4 wherein the offset is applied to the PNS is repeatedly done within each of the masks to provide offsets in increasing powers of 2.

6. A transmitter comprising:
   an input for an information signal;
   a power supply;
   a microcontroller connected to the power supply;
   a linear feedback shift register (LFSR) for producing a PNS at an output;
   a plurality of LFSR masks each having a mask input and a mask output, the mask input having a version of the PNS and the mask output providing a shifted version of the PNS with respect to the version of the PNS provided to the mask input, the LFSR masks forming a series of previous and subsequent LFSR masks;
   a plurality of registers within each of the masks arranged to form a binary shift register, each register a having a register input and a register output sequentially connecting the registers, the registers being operatively configured such that bits defining the version of the PNS will be shifted from a first register to a last register;
   a series a switches within each of the LFSR masks operatively connected to receive the register outputs, each of the switches having a switch input and a switch output; and
   a series of adders within each of the LFSR masks, each of the adders having at least a first input, a second input and a single output, and wherein the switches selectively controls the adders to operate on the first input and the second input or to pass the second input to the single output, wherein either the version of the PNS or the shifted version of the PNS is output by the series of adders;

wherein the mask input of a first LFSR mask in the LFSR mask series is connected to the output of the LFSR, the mask input of each subsequent LFSR mask in the LFSR series is connected to the single output of the switch of the previous LFSR mask;

a spreader to spread the information signal depending on the output of the switch for a last LFSR mask in the series of LFSR masks; and transmitter apparatus for transmitting the spread information signal into a medium.

7. The transmitter of claim 6, in which:

the medium is selected from: computer media in a media drive of the transmitter, a broadband network connected to the transmitter, and an antenna together with an open space through which radio waves travel; and the microcontroller includes a processor, a memory, and a clock interconnected by a bus;

each mask shifts the PNS by a different power of 2 bits;

the microcontroller maps the bits of a desired offset onto the switches to provide the desired offset.

8. The transmitter of claim 6 wherein the series of adders perform modulo-2 addition.

9. The transmitter of claim 8 wherein an offset is applied to the PNS is determined by a set of values that are applied to the switches.

10. The transmitter of claim 9 wherein the offset is applied to the PNS is repeatedly done within each of the masks to provide offsets in increasing powers of 2.

11. A transmitter comprising:

receiver means for receiving a spread information signal from a medium;

a power supply;

a microcontroller connected to the power supply;

a linear feedback shift register (LFSR) for producing a PNS at an output;

a plurality of LFSR masks each having a mask input and a mask output, the mask input having a version of the PNS and the mask output providing a shifted version of the PNS with respect to the version of the PNS provided to the mask input, the LFSR masks forming a series of previous and subsequent LFSR masks;

a plurality of registers within each of the masks arranged to form a binary shift register, each register a having a register input and a register output sequentially connecting the registers, the registers being operatively configured such that bits defining the version of the PNS will be shifted from a first register to a last register;

a series a switches within each of the LFSR masks operatively connected to receive the register outputs, each of the switches having a switch input and a switch output; and a series of adders within each of the LFSR masks, each of the adders having at least a first input, a second input and a single output, and wherein the switches selectively controls the adders to operate on the first input and the second input or to pass the second input to the single output, wherein either the version of the PNS or the shifted version of the PNS is output by the series of adders;

wherein the mask input of a first LFSR mask in the LFSR mask series is connected to the output of the LFSR, the mask input of each subsequent LFSR mask in the LFSR series is connected to the single output of the switch of the previous LFSR mask, the output of the switch for a last LFSR mask in the series of LFSR masks, provides a PNS generator output;

a de-spreader to de-spread the spread information signal depending on the PNS generator output to produce a recovered information signal; and an output for the recovered information signal.

12. The transmitter of claim 11 wherein the series adders perform modulo-2 addition.

13. The transmitter of claim 12 wherein an offset is applied to the PNS is determined by a set of values that are applied to the switches.

14. The transmitter of claim 13 wherein the offset is applied to the PNS is repeatedly done within each of the masks to provide offsets in increasing powers of 2.

15. A method of operating a recursive system, with an output depending on a plurality of previous outputs comprising the steps of:

processing the plurality of previous outputs from a linear feedback shift register to obtain processed values;

storing the processed values within a mask;

determining new outputs within the mask depending on the processed values; and reverse processing the processed values within the mask to obtain the previous outputs.

16. The method of operating a recursive system, as defined by claim 15 wherein the step of determining further comprises:

placing the plurality of previous outputs within a series of registers within the mask; and selectively switching values contained within the registers to inputs on a series of modulo-2 adders.

17. The method of claim 16 wherein the step of reverse processing further comprises controlling the modulo-2 adders to obtain a delayed version of the previous outputs.

18. The method of claim 17 wherein the steps of storing, determining and reverse processing are repeatedly performed in a series of masks in a sequential manner in order to obtain a desired order of delay within the previous outputs.

* * * * *